United States Patent [19]

Bolden

[11] 4,033,430

[45] July 5, 1977

[54] SPEAKER ENCLOSURE

[75] Inventor: Edward J. Bolden, Bronx, N.Y.

[73] Assignee: The Raymond Lee Organization, Inc., New York, N.Y. ; a part interest

[22] Filed: June 9, 1976

[21] Appl. No.: 694,088

[52] U.S. Cl. .............................. 181/144; 181/145; 181/154; 181/199

[51] Int. Cl.² .................... H05K 5/00; A47B 81/06

[58] Field of Search .......... 181/145, 144, 148, 154, 181/199; 179/1 E

[56] References Cited

UNITED STATES PATENTS

| | | | |
|---|---|---|---|
| 2,036,832 | 4/1936 | Scheldorf | 181/145 |
| 2,801,704 | 8/1957 | Martin | 181/144 |
| 3,931,867 | 1/1976 | Janszen | 181/144 |
| 3,983,333 | 9/1976 | Allison | 181/144 |

*Primary Examiner*—Stephen J. Tomsky
*Attorney, Agent, or Firm*—Daniel Jay Tick

[57] ABSTRACT

A speaker is enclosed in furniture cabinets consisting of three units. The base cabinet, supported on legs, is a rectangular parallelepiped and accommodates a full range speaker. The top cabinet is pyramidal and accommodates a tweeter at one of its sides. An intermediate cabinet of smaller dimensions than either the base or top cabinets is interposed between the two and opens into both and accommodates a tweeter control.

2 Claims, 3 Drawing Figures

SPEAKER ENCLOSURE

BACKGROUND OF THE INVENTION

The present invention relates to a speaker enclosure. Objects of the invention are to provide a speaker enclosure of simple structure, which is inexpensive in manufacture, and which houses the full range speaker, tweeter and tweeter control of a high fidelity sound reproduction system in an attractive, pleasant appearing article of furniture which enhances the appearance of a room in which it is placed.

BRIEF DESCRIPTION OF THE DRAWINGS:

In order that the invention may be readily carried into effect, it will now be described with reference to the accompanying drawings, wherein.

DETAILED DESCRIPTION OF THE INVENTION

The speaker enclosure of the invention is an attractive and pleasant appearing article of furniture for housing the basic components of a high fidelity sound reproduction system.

Figure 1:
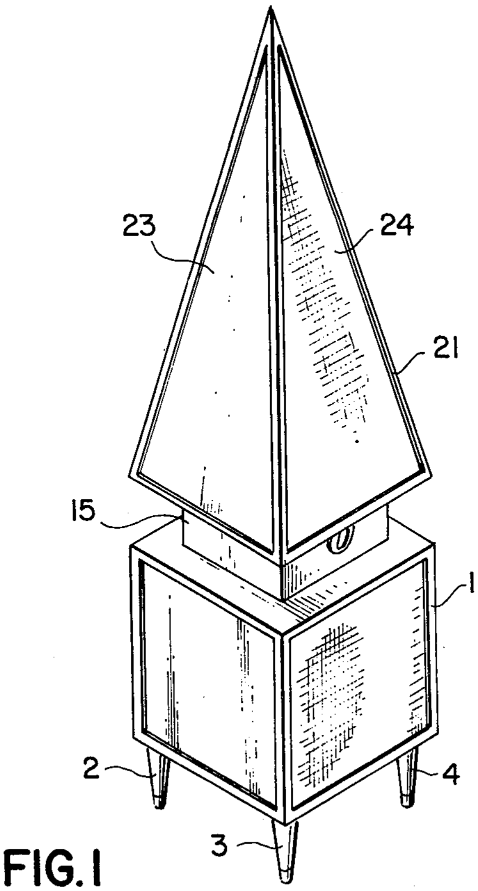
FIG. 1 is a perspective view of an embodiment of the speaker enclosure of the invention.
Figure 3:
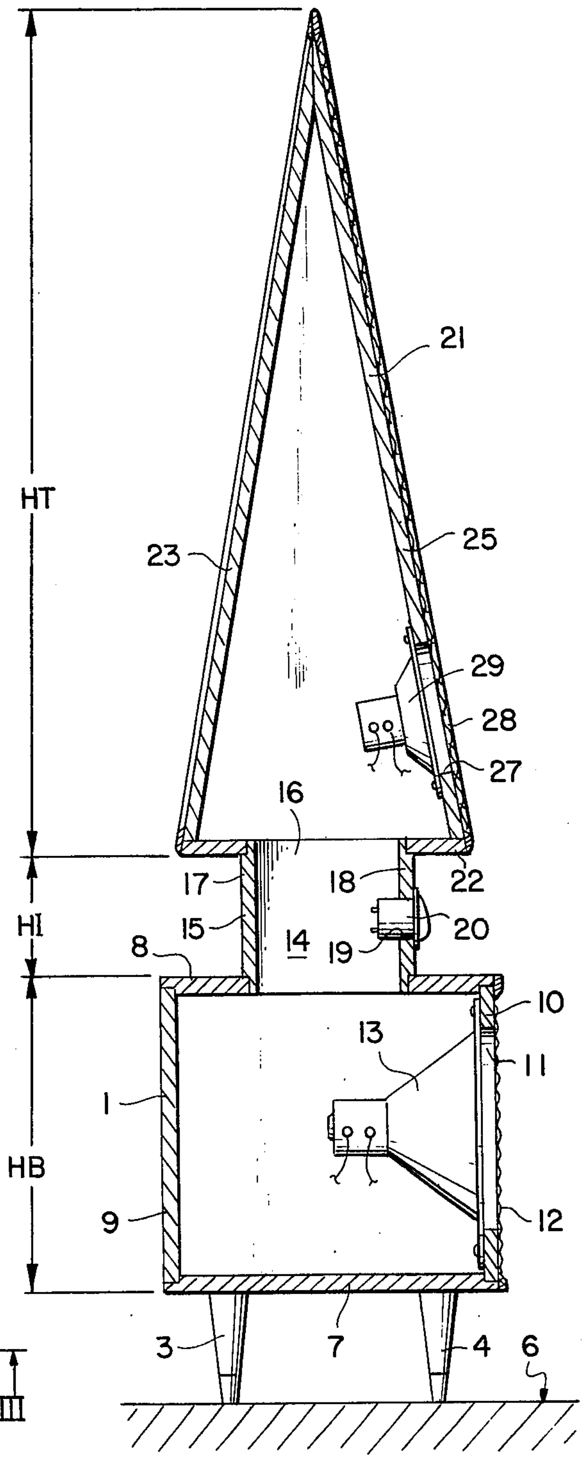
FIG. 3 is a cross-sectional view, taken along the lines III—III, of FIG. 2.

The speaker enclosure of the invention comprises a substantially rectangular parallelepiped base cabinet 1 (FIGS. 1 and 3) mounted on legs 2, 3, 4 (FIG. 1) and 5 (Not shown in the FIGS.) supporting it at a predetermined distance above a supporting surface 6 (FIG. 3). The base cabinet 1 has a bottom 7, a top 8 spaced from and parallel to the bottom, as shown in FIG. 3, and four sides, of which two sides 9 and 10 are shown in FIG. 3.

The sides 9, 10, and so on, are perpendicular to the top 8 and bottom 7. A side hole 11 is formed through the side 10 and is covered by a grill 12 for accommodating a full range speaker 13, as shown in FIG. 3. A top hole 14 is formed through the top 8 (FIG. 3).

A substantially rectangular parallelepiped intermediate cabinet 15 (FIGS. 1 and 3) is of smaller dimensions than the base cabinet 1 and is mounted on said cabinet. The intermediate cabinet 15 has an open bottom coinciding with the top hole 14 formed through the top 8 of the base cabinet 1, an open top 16 and four sides perpendicular to the top 8 of the base cabinet and surrounding the top hole 14 of the base cabinet.

Two of the sides 17 and 18 of the intermediate cabinet are shown in FIG. 3. A side hole 19 is formed through the side 18 of the intermediate cabinet 15 and accommodates a tweeter control 20.

Figure 2:
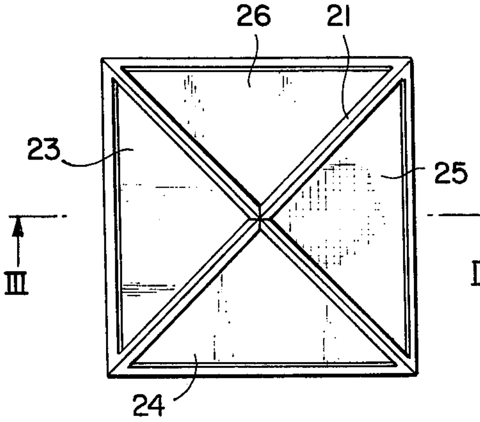
FIG. 2 is a top plan view, on an enlarged scale, of the embodiment of FIG. 1.

A substantially pyramidal top cabinet 21 is mounted on the intermediate cabinet 15 and has a bottom 22 (FIG. 3) and four triangular sides, 23, 24, 25 and 26, as shown in FIG. 2.

As shown in FIG. 3, the top cabinet 21 has a bottom hole formed through the bottom 22 and coincident with the open top 16 of the intermediate cabinet 15. A side hole 27 is formed through the side 25 and is covered by a grill 28. The side hole 27 accommodates a tweeter 29 (FIG. 3).

The height HI (FIG. 3) of the intermediate cabinet 15 is less than half the height HB of the base cabinet 1. The height HT of the top cabinet 21 is more than twice that of the base cabinet 1, as shown in FIG. 3.

While the invention has been described by means of a specific example and in a specific embodiment, I do not wish to be limited thereto, for obvious modifications will occur to those skilled in the art without departing from the spirit and scope of the invention.

I claim:

1. A speaker enclosure, comprising a substantially rectangular parallelipiped base cabinet mounted on legs supporting it at a predetermined distance above a supporting surface, said base cabinet having a bottom, a top spaced from and parallel to the bottom and four sides perpendicular to the top and bottom, a side hole formed through one of the sides and covered by a grill and accommodating a full range speaker and a top hole formed through the top;

a substantially rectangular parallelepiped intermediate cabinet of smaller dimensions than the base cabinet mounted on said base cabinet, said intermediate cabinet having an open bottom, an open top and four sides perpendicular to the top of the base cabinet and surrounding the top hole of the base cabinet and a side hole formed through one of the sides for accommodating a tweeter control; and a substantially pyramidal top cabinet mounted on the intermediate cabinet and having a bottom and four triangular sides, a bottom hole formed through the bottom and coincident with the open top of the intermediate cabinet and a side hole formed through one of the sides and covered by a grill and accommodating a tweeter.

2. A speaker enclosure as claimed in claim 1, wherein the height of the intermediate cabinet is less than half that of the base cabinet and the height of the top cabinet is more than twice that of the base cabinet.

* * * * *